United States Patent
Nakazato et al.

(10) Patent No.: US 8,547,502 B2
(45) Date of Patent: Oct. 1, 2013

(54) LIGHT SOURCE MODULE

(75) Inventors: Norio Nakazato, Inzai (JP); Kimihiko Sudo, Yokohama (JP); Hiroshi Akai, Fujisawa (JP); Naoki Yotsumoto, Tachikawa (JP); Hiroshi Oyama, Hitachi (JP); Shigeyuki Sasaki, Kasumigaura (JP); Atsushi Hatakeyama, Ome (JP); Takaaki Maruyama, Ome (JP); Kouichi Tanabe, Ome (JP)

(73) Assignee: Hitachi Consumer Electronics Co., Ltd., Tokyo (JP)

( * ) Notice: Subject to any disclaimer, the term of this patent is extended or adjusted under 35 U.S.C. 154(b) by 785 days.

(21) Appl. No.: 12/254,852

(22) Filed: Oct. 21, 2008

(65) Prior Publication Data
US 2009/0103005 A1    Apr. 23, 2009

(30) Foreign Application Priority Data
Oct. 23, 2007    (JP) .................................. 2007-274622

(51) Int. Cl.
*G02F 1/13339*    (2006.01)
(52) U.S. Cl.
USPC .................................. 349/69; 257/88; 257/99
(58) Field of Classification Search
USPC .................................. 349/61–62; 257/88, 99
See application file for complete search history.

(56) References Cited

U.S. PATENT DOCUMENTS

| | | | |
|---|---|---|---|
| 6,285,420 B1 * | 9/2001 | Mizumo et al. | 349/65 |
| 7,250,637 B2 * | 7/2007 | Shimizu et al. | 257/98 |
| 7,455,461 B2 * | 11/2008 | Hohn et al. | 385/93 |
| 7,513,670 B2 * | 4/2009 | Yang et al. | 362/609 |
| 2004/0065894 A1 | 4/2004 | Hashimoto et al. | |
| 2007/0228516 A1 | 10/2007 | Plank et al. | |
| 2009/0072250 A1 | 3/2009 | Inoue | |
| 2009/0224278 A1 | 9/2009 | Nagai | |

FOREIGN PATENT DOCUMENTS

| | | |
|---|---|---|
| JP | 9-185055 | 7/1997 |
| JP | 2003-152225 | 5/2003 |
| JP | 2005-353507 | 12/2005 |
| JP | 2006-093672 | 4/2006 |
| JP | 2006-203080 | 8/2006 |
| JP | 2007-184319 | 7/2007 |
| WO | WO 2006/062239 | 6/2006 |
| WO | WO 2007/102534 | 9/2007 |

* cited by examiner

*Primary Examiner* — Eric Wong
(74) *Attorney, Agent, or Firm* — Antonelli, Terry, Stout & Kraus, LLP.

(57) ABSTRACT

It is to provide a light source module capable of downsizing an edge-light type backlight in thickness and reducing the usage amount of resin. A method of manufacturing a light source module includes a process of preparing a substrate with a first reflector including a reflecting surface mounted thereon, a process of mounting a plurality of light emitting elements on the substrate, a process of mounting a wiring board having an electrode on the substrate, a process of connecting the electrode of the light emitting element and the electrode of the wiring board with metal wire, a process of mounting a second reflector having a reflecting surface on the wiring board, and a process of filling the space between the first reflector and the second reflector, with resin.

16 Claims, 6 Drawing Sheets

AA SECTION

BB SECTION

LIGHT SOURCE MODULE

BACKGROUND OF THE INVENTION

1. Technical Field

The invention relates to a light source module using an LED and a manufacturing method thereof, and more particularly, to a preferred LED light source module for use in a backlight of a liquid crystal monitor.

2. Background Art

As a backlight of a liquid crystal monitor, an LED (light-emitting diode) has been used recently. A backlight using an LED includes a direct type in which LEDs are arranged on the rear side of a liquid crystal panel and an edge-light type in which LEDs are arranged at the lower edge of a liquid crystal panel. In the edge-light type backlight, LEDs are arranged in lines at the lower edge portion of a liquid crystal panel and a light from an LED is guided to the rear side of the liquid crystal panel by a light guide plate, to illuminate the whole surface of the liquid crystal panel equally.

The edge-light type backlight can be adopted to make a liquid crystal television thinner but it enlarges the size of the liquid crystal television in the vertical direction. Therefore, in order to reduce the size of the liquid crystal television in the vertical direction, it is necessary to reduce the height of each LED.

Recently, a thin liquid crystal display device has been developed. In the liquid crystal display device, the thickness of an edge-light type backlight has to be further reduced.
Patent Document 1 Japanese Patent Application Laid-Open (JP-A) No.

DISCLOSURE OF THE INVENTION

Problems to be solved by the Invention

An LED used as an edge-light type backlight is sealed by resin having a high refractive index. A silicon resin is generally used as this type of resin. The price of a silicon resin, however, is high comparatively. JP-A No. 2006-93672 discloses a semiconductor light emitting device designed to house a light emitting device in a recess which is provided in a lead or a support. In the example of the publication, since each package is sealed by resin, the usage amount of resin can be reduced, but a work of filling the resin becomes complicated.

On the other hand, there is a method for forming a line-shaped long light source module by mounting a plurality of LED chips on a base and sealing all the LEDs by single filling of resin. In this method, however, a work of filling the resin becomes easy, but the usage amount of silicon resin increases, hence to increase the cost.

The light source module dissipates heat from the LEDs through the silicon resin sealing the LEDs. In other words, the resin sealing the LEDs has a function of dissipating the heat from the LEDs. Therefore, a light incident edge surface of a light guide plate is formed of thermal deformable methacrylate, which is protected from the heat of the LEDs. When the usage amount of silicon resin is reduced, however, the resin's function of dissipating heat is deteriorated and the light incident edge surface of the light guide plate can be affected by the heat. In addition, when the usage amount of silicon resin is reduced, a space between the surface of the silicon resin and the light incident surface of the light guide plate becomes wider and the light use efficiency is reduced.

The purpose of the invention is to provide a light source module which can be downsized in depth with the reduced usage amount of resin.

A method of manufacturing a light source module, according to the invention includes: a first process of preparing a substrate with a first reflector including a reflecting surface mounted thereon; a second process of mounting a plurality of light emitting elements on the substrate so that each of the light emitting elements is put near the reflecting surface of the first reflector to reflect light from the light emitting element; a third process of mounting a wiring board including an electrode on the substrate so that the electrode of the wiring board approaches to the light emitting element and that the light emitting element is sandwiched between the first reflector and the wiring board; a fourth process of connecting the electrode of the light emitting element and the electrode of the wiring board with metal wire; a fifth process of mounting a second reflector including a reflecting surface on the wiring board so that the light from the light emitting element is reflected on the reflecting surface of the second reflector and that the light emitting element is sandwiched between the first reflector and the second reflector; and a sixth process of filling a space between the first reflector and the second reflector with resin, to seal the light emitting element.

The invention can provide a light source module which can be downsized in depth with the reduced usage amount of resin.

DESCRIPTION OF REFERENCE NUMERALS

11 . . . substrate, 11a . . . recess, 12 . . . substrate, 12a . . . reflector unit, 12b . . . engagement portion, 13 . . . wiring board, 14 . . . multi-layer wiring board, 15 . . . adhesive sheet, 16, 17, 18, 19 . . . reflector, 21 . . . LED, 22 . . . submount, 23 . . . silver paste, 25 . . . metal wire, 26 . . . resin, 50 . . . light guide plate, 52 . . . radiation heat sink, 52a . . . fin, and 53 . . . liquid crystal panel module

DESCRIPTION OF PREFERRED EMBODIMENT

Figure 1:
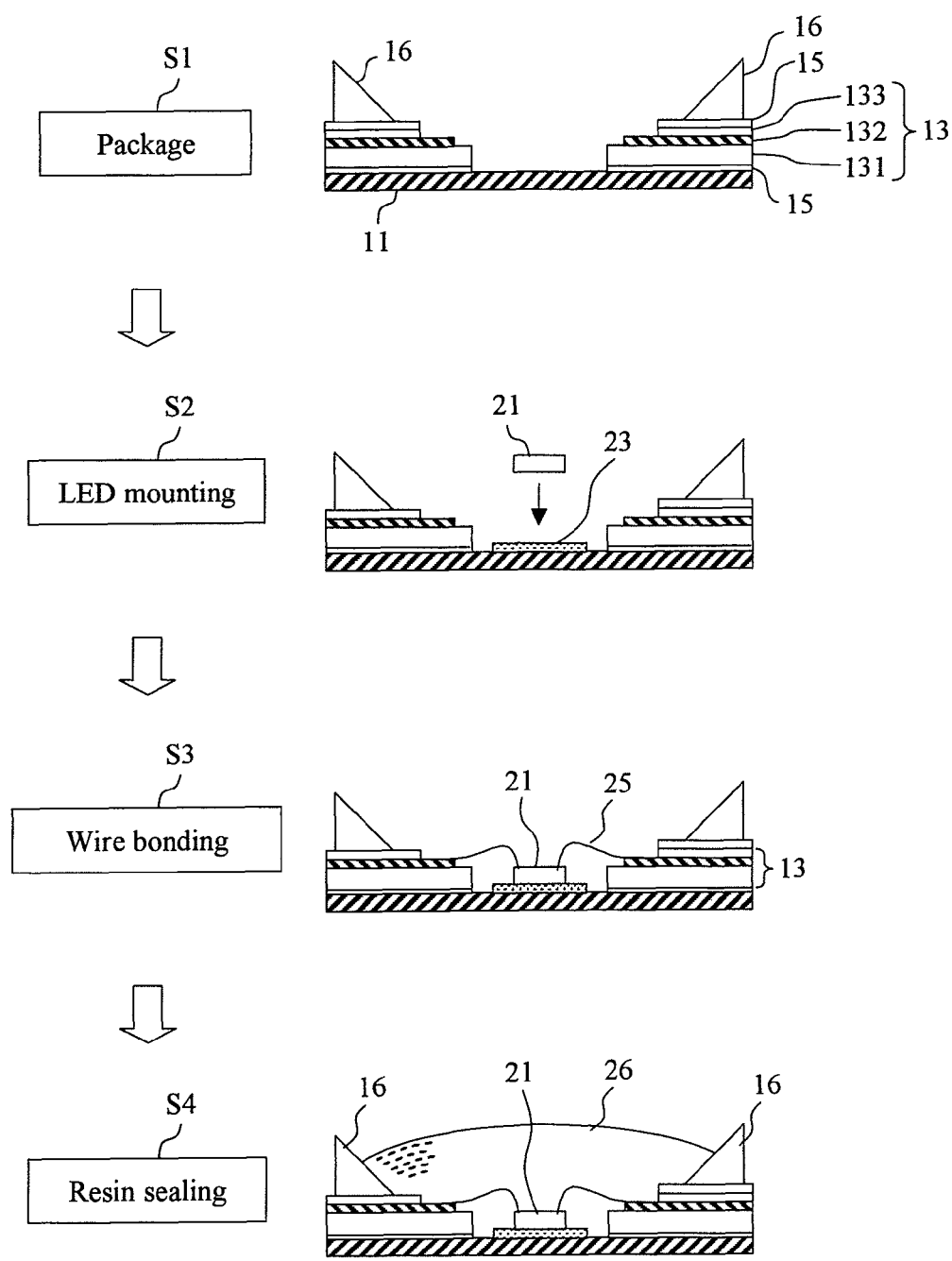
FIG. 1 is a diagram showing an example of a method of manufacturing the conventional light source module.

Referring to FIG. 1, a process of assembling the conventional light source module will be described. FIG. 1 shows a cross sectional structure of the light source module which is cut along a vertical plane orthogonal to the liquid crystal display surface. Therefore, The liquid crystal display surface is vertical to the plane of paper. In Step S1, a package board is prepared. The package board is generally provided from another process, another factory, or another company. The package board has a substrate 11, a wiring board 13 disposed on the substrate, and a reflector 16 arranged on the wiring board. The wiring board 13 is attached on the substrate 11 through an adhesive sheet 15, the reflector 16 is attached on the wiring board 13 through the adhesive sheet 15. The wiring board 13 is a three-layer board comprising an insulating layer 131, a metal layer 132 put thereon, and an insulating layer 133 put thereon.

In Step S2, an LED 21 is mounted. In this specification, an LED chip will be referred to simply as an LED. A silver paste 23 is applied to the substrate 11 and the LED 21 is arranged thereon. In this way, the LED 21 is bonded to the substrate 11. In Step S3, wire bonding is carried out. An electrode of the wiring board 13 is electrically connected to the LED 21 by a metal wire 25. In Step S4, resin sealing is carried out. The resin 26 is filled to coat the LED 21. The light source module is completed by hardening the resin 26.

The reflector 16 has a function of reflecting a light from the LED 21 to guide the light upward, also serving as a wall for protecting the resin 26 from flowing out. In other words, the resin 26 is retained in a region surrounded by the reflector 16. In order to efficiently lead the light from the LED 21 forwardly, it is preferable that the reflector 16 is arranged near the LED 21. However, in the case that the reflector 16 is arranged near the LED 21, when the LED 21 is mounted, there is a fear that a tool used for it may interfere with the reflector 16. Also in the wire bonding, there is a fear that a wire and a tool may interfere with the reflector 16. The reflector 16 is generally arranged at a position far from the LED 21. Therefore, the size of the reflector 16 becomes large from the viewpoint of an optical reason. Further, the usage amount of resin required for sealing is increased.

Figure 2:
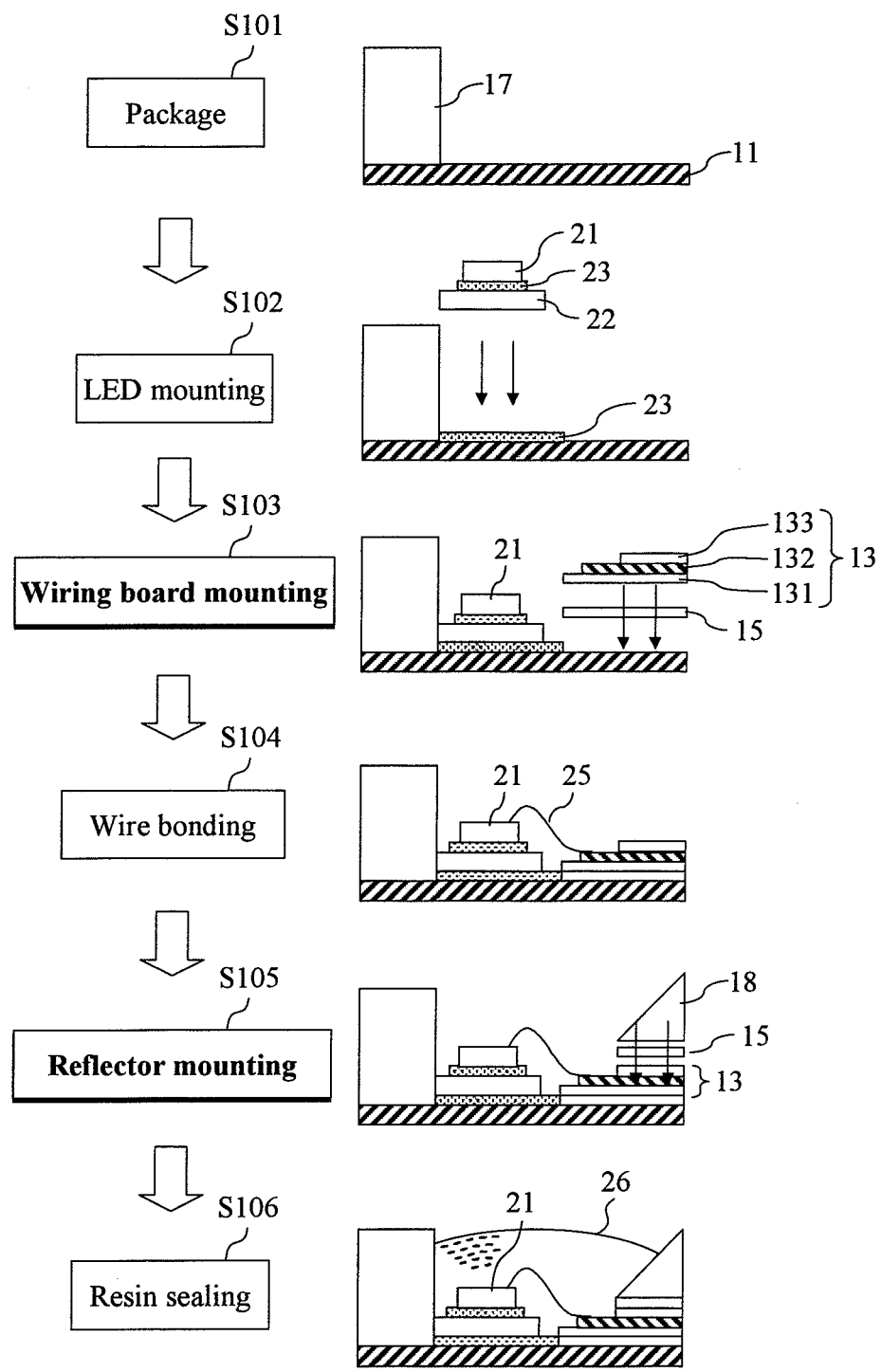
FIG. 2 is a diagram showing an example of a method of manufacturing a light source module according to the invention.

Referring to FIG. 2, the process of assembling the light source module according to the invention will be described. FIG. 2 shows a cross sectional structure of the light source module which is cut along a vertical plane orthogonal to the liquid crystal display surface. In Step S101, a package board is prepared. The package board according to the example has a substrate 11 and a first reflector 17 attached to it. The substrate 11 may be formed of a metal plate with high heat conductivity, for example, like an aluminum plate or may be formed of a ceramic substrate with high heat radiation. The first reflector 17 may be formed of a material with high heat conductivity, for example, a metal such as aluminum or copper. When the aluminum is used, the reflector may be manufactured at a low cost by extrusion processing. The first reflector 17 may be formed separately from the substrate 11, or it may be formed integrally with the substrate 11.

The first reflector 17 has a reflecting surface. When the LED 21 is mounted, the light from the LED 21 is reflected on the reflecting surface and the surface is vertical to the substrate 11 in the example. The whole reflecting surface or outer surface of the first reflector 17 is coated with a white reflective film in order to improve surface reflectance. The white reflective film may be formed by anodizing treatment or it may be formed by applying a white solder resist.

In Step S102, the LED 21 is mounted on the substrate 11. As shown in the figure, the LED 21 is mounted on the submount 22. The LED 21 is previously attached to the submount 22 with the silver paste 23. The silver paste 23 is applied to the substrate 11 and the LED 21 is mounted thereon together with the submount 22. FIG. 2 shows the cross sectional structure of the light source module which is cut along a vertical plane orthogonal to the liquid crystal display surface and a plurality of LEDs 21 are arranged along the direction vertical to the plane of paper.

The submount 22 is designed to have an electrode formed on an insulating board. The board may be formed of insulating ceramics comprising aluminum nitride, alumina or the like, or it may be a silicon board with its surface processed by thermal oxidation process to secure insulation properties.

The light emitting property of the LED 21 is not uniform. Then, before the LED 21 is mounted on the substrate 11, a property test is carried out for checking the light emitting property of the LED 21. At this time, the test becomes easier when the LED 21 is mounted on the submount 22 than when it's not. This is because an extraction electrode for making contact with the rear surface electrode of the LED 21 is formed on the top surface of the submount 22. When the property test of the LED 21 is carried out, a probe may be made contact with the extraction electrode of the submount 22, instead of making the probe contact with the rear surface electrode of the LED 21.

In the example, after the test for checking the light emitting property of the LED 21 is performed, a combination of the LEDs 21 to be mounted on the light source module is selected based on the light emitting property of the LED 21. As the result, a light source module satisfying a predetermined standard can be obtained.

In Step S103, a wiring board 13 is mounted. Namely, the wiring board 13 is attached to the substrate 11 with the adhesive sheet 15. The wiring board 13 is mounted near the LED 21 and the submount 22. The wiring board 13 is a three-layer board comprising an insulating layer 131, a metal layer 132 put thereon, and an insulating layer 133 put thereon. The wiring board 13 may be a glass epoxy board or it may be a flexible board such as a polyimide wiring board. As the glass epoxy board, there is the FR4 board.

In Step S104, the wire bonding is carried out. The electrode on the wiring board 13 and the electrode on the upper surface of the LED 21 are electrically connected by a metal wire 25. The electrode on the wiring board 13 and the electrode on the submount 22 are also connected by the metal wire 25. For example, the metal wire may be a gold wire. In Step S105, a second reflector 18 is mounted. Specifically, the second reflector 18 is attached to the wiring board 13 with the adhesive sheet 15. The second reflector 18 has an inclined reflecting surface. The whole reflecting surface or the outer surface of the second reflector 18 is coated with the white reflective film in order to improve the surface reflectance. In Step S106, resin sealing is carried out. The resin 26 is filled to cover the LED 21. As described above, the resin 26 may be the silicon resin. The resin 26 is retained between the two reflectors 17 and 18. By hardening the resin 26, the light source module is completed.

In the light source module in the example, the first reflector 17 has the reflecting surface vertical to the substrate 11 and the second reflector 18 has the inclined reflecting surface with respect to the substrate 11. However, the two reflectors may have the reflecting surfaces vertical to the substrate 11 or the two reflectors may have the inclined reflecting surfaces.

Figure 3:
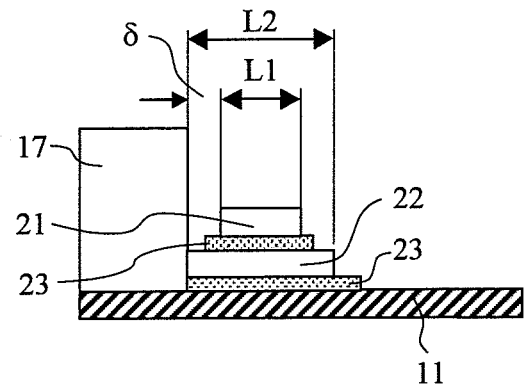
FIG. 3 is a diagram for explaining the size of an LED and a submount in the light source module according to the invention.

Referring to FIG. 3, the sizes of the LED 21 and the submount 22 will be described. As shown in the figure, the submount 22 is attached to the substrate 11 with the silver paste 23. Further, the LED 21 is attached to the submount 22 with the silver paste 23. The size in plan view of the LED 21 is defined as L1, the thickness of the LED chip 21 is defined as t1, and the size in plan view of the submount 22 is defined as L2. From the reason of the characteristic of dielectric strength voltage, these sizes are preferably in the following relationship.

$$L2 \geq L1 + t1 \times 2 \qquad \text{formula 1}$$

Transformation of this formula leads to the following formula.

$$(L2-L1)/2 \geq t1 \qquad \text{formula 2}$$

As shown in the figure, when the submount 22 is arranged so as to come into contact with the first reflector 17, the left side of the formula 2 shows a space δ between the first reflector 17 and the LED 21. Therefore, the formula 2 means that the space δ between the first reflector 17 and the LED 21 is larger than the thickness t1 of the LED chip 21.

Therefore in the example, when the thickness t1 of the LED chip 21 becomes larger, the space δ between the first reflector 17 and the LED 21 has to be enlarged.

Figure 4:
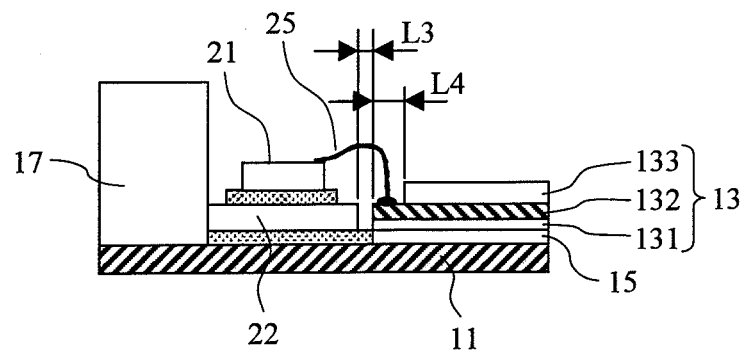
FIG. 4 is a diagram for explaining the size between a wiring board and the submount in the light source module according to the invention.

Referring to FIG. 4, the distance between the wiring board 13 and the LED 21 will be described. The distance between the edge surface of the submount 22 and the edge surface of the wiring board 13 is defined as L3. An outer diameter of the metal wire 25 is defined as d. From the reason of the characteristic of dielectric strength voltage, these sizes are preferably in the following relationship.

$$L3 \geq 50 \text{ micron} \qquad \text{formula 3}$$

or $$L3 \geq d \times 2 \qquad \text{formula 4}$$

The size of the electrode on the wiring board 13 is defined as L4. The size L4 of the electrode is set based on the shape of the bonding tool such that the bonding tool does not suffer interference from the wiring board 13. The size, however, has to be at least four or five times larger than the outside diameter of the metal wire 25.

$$L4 \geq d \times (4 \sim 5) \qquad \text{formula 5}$$

Figure 5:
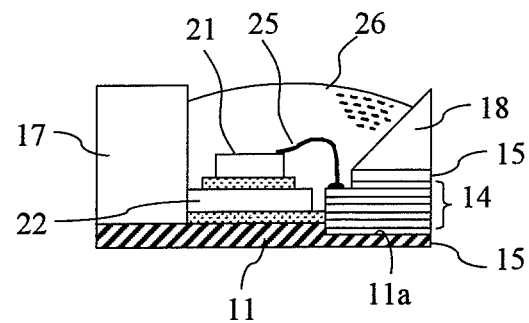
FIG. 5 is a diagram showing a second example of the light source module according to the invention.

FIG. 5 shows a second example of the light source module according to the invention. In the example, a multi-layer wiring board 14 is used as the wiring board. Since the thickness of the multi-layer wiring board 14 is large, the distance between the reflecting surface of the second reflector 18 mounted on the multi-layer wiring board 14 and the LED 21 becomes large. Therefore, of all the light emitted from the side surface of the LED chip 21, the amount of the light incident to the reflecting surface of the second reflector 18 becomes smaller. Then, in the example, a recess 11a for arranging the multi-layer wiring board 14 is formed in the substrate 11. Hence, the position of the second reflector 18 mounted on the multi-layer wiring board 14 moves downwardly. Therefore, of the light emitted from the side surface of the LED chip 21, the amount of the light incident to the reflecting surface of the second reflector 18 can be increased. Also, in the example, the first reflector 17 may have the inclined reflecting surface.

Figure 6:
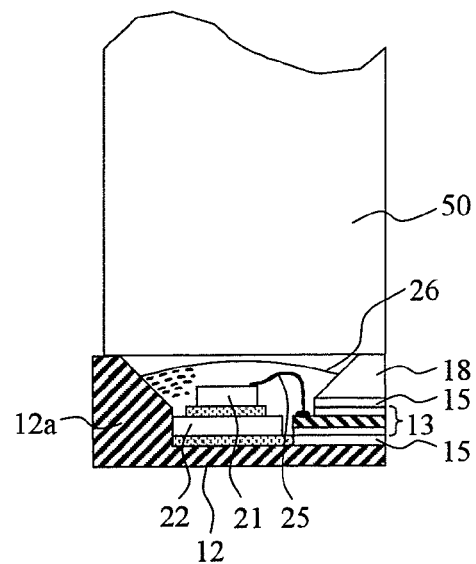
FIG. 6 is a diagram showing an example of a backlight module according to the invention.

FIG. 6 shows an example of a backlight module according to the invention. The backlight module of the example has the light source module and a light guide plate 50. In the light source module of the example, the first reflector is integrally formed with the substrate. In the example, the substrate 12 has a reflector unit 12a. The reflector unit 12a has a shape similar to that of the second reflector 18. Further, the light source module of the example has the light guide plate 50. The light guide plate 50 is arranged on both the reflector unit 12a of the substrate 12 and the second reflector 18. The method of manufacturing the light source module in the example is similar to the method shown in FIG. 2.

Figure 7:
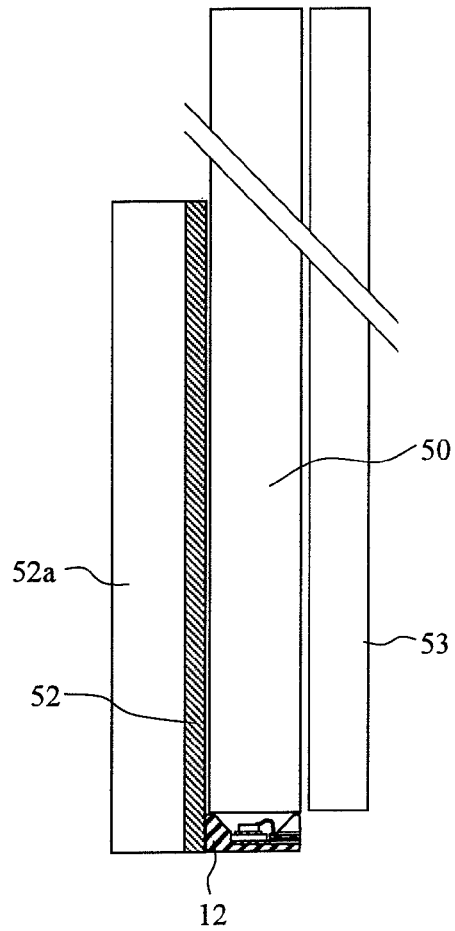
FIG. 7 is a diagram showing an example of a liquid crystal display device according to the invention.

FIG. 7 shows an example of a liquid crystal display device according to the invention. The liquid crystal display device of the example has the backlight module shown in FIG. 6, a liquid crystal panel module 53, and a radiation heat sink 52. The radiation heat sink 52 has a plurality of fins 52a.

The radiation heat sink 52 is connected to the reflector unit 12a of the substrate 12. The heat from the LED 21 is transferred to the radiation heat sink 52 through the reflector unit 12a of the substrate 12. Therefore this can prevent the temperature of the resin 26 from rising. Of the heat generated from the LED 21, the amount of the heat directly transferred to the light guide plate 50 through the resin 26 can be reduced. As the result, such a possibility is decreased that the light guide plate 50 may be affected by the heat from the LED 21. In the example, a necessity for dissipating the heat from the LED 21 by the resin is reduced. Therefore, it is possible to reduce the usage amount of resin.

In the example, since the usage amount of resin can be reduced, the light guide plate 50 can be arranged near the LED 21, hence to improve the light use efficiency.

Figure 8:
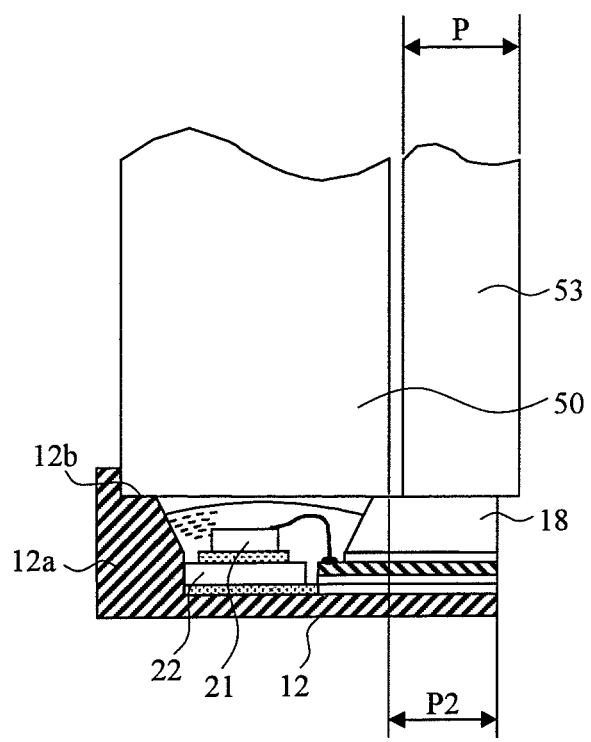
FIG. 8 is a diagram showing a second example of the liquid crystal display device according to the invention.

Referring to FIG. 8, another example of the liquid crystal display device will be described. In the liquid crystal display device of the example, an engagement portion 12b to be engaged with the lower edge of the rear side of the light guide plate 50 is formed in the reflector unit 12a of the substrate 21. The engagement portion 12b is formed as a groove or a recess. In this way, by providing the engagement portion 12b in the reflector unit 12a of the substrate, positioning of the light guide plate 50 becomes easier with higher precision.

The light guide plate 50 and the liquid crystal panel module 53 are arranged on the upper surface of the second reflector 18. Specifically, the lower edge of the front surface of the light guide plate 50 is put on the rear side portion in the upper surface of the first reflector 18 and the liquid crystal panel module 53 is put on the front side portion in the upper surface of the first reflector 18. In the upper surface of the first reflector 18, the front side portion forms a liquid crystal panel supporting unit 18a. Therefore, the liquid crystal panel module 53 can be mounted easily.

When the thickness of the liquid crystal panel module 53 is defined as P and the size of the liquid crystal panel supporting unit 18a on the upper surface of the first reflector 18 is defined as P2, they shall be set so that the expression P2<P is satisfied. As the result, the front surface of the liquid crystal panel module 53 is protruded frontward from the front surface of the light source module. As shown in the figure, a space may be provided between the light guide plate 50 and the liquid crystal panel module 53.

In the example, since the engagement portion 12b is provided in the reflector unit 12a of the substrate 12 and the liquid crystal panel supporting unit 18a is formed on the upper surface of the second reflector 18, the process of positioning both the light guide plate and the liquid crystal panel becomes simple and the assembling work of the liquid crystal display device becomes easy.

Further, it can realize a exceedingly compact light source module at a low cost, with high reliability and high optical performance, without too many optical parts. Furthermore, it can realize a thin and compact liquid crystal display.

Figure 9A:
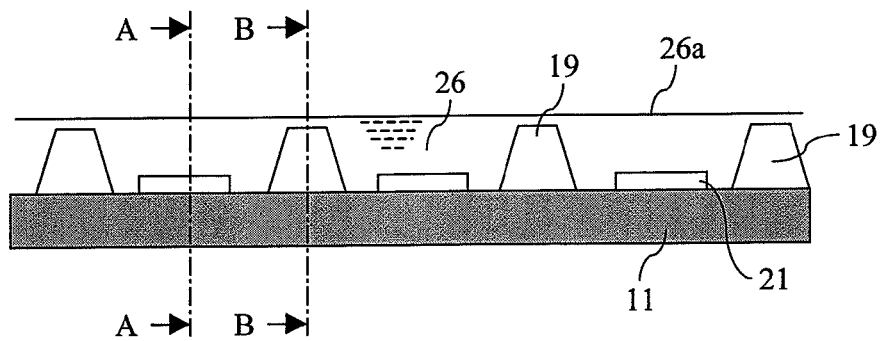
FIGS. 9A, 9B and 9C are diagrams showing a third example of the light source module according to the invention.
Figure 9B:
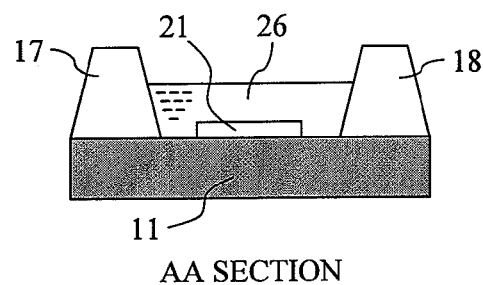
Figure 9C:
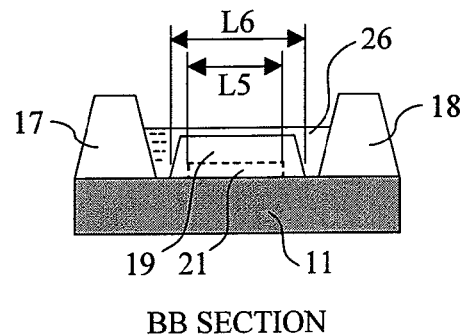

Referring to FIGS. 9A, 9B and 9C, a third example of the light source module according to the invention will be described. FIG. 9A shows the cross sectional structure of the light source module in the example which is cut along a vertical plane parallel to the liquid crystal display surface.

FIG. 9B shows the cross sectional structure of the light source module in the example which is cut along the vertical plane AA orthogonal to the liquid crystal display surface. FIG. 9C shows the cross sectional structure of the light source module in the example which is cut along the vertical plane BB orthogonal to the liquid crystal display surface. As shown in FIG. 9A, in the example, third reflectors 19 are provided in the both sides of the LED 21 on the substrate 11. Each of the third reflectors 19 is extended in the direction orthogonal to the liquid crystal display surface. The third reflector 19 has an inclined reflecting surface. The whole reflecting surface or the outer surface of the third reflector 19 is coated with the white reflective film.

In the example, all the LEDs 21 are sealed with the single resin 26. Therefore, the usage amount of resin increases more than that in the case of sealing the respective LEDs 21 with the resin one by one. However, by providing the third reflectors 19, the usage amount of the sealing resin can be reduced by the amount corresponding to the volume occupied by the third reflectors 19.

As shown in the figure, by making the height of a liquid surface 26a of the resin 26 higher than that of the third reflectors 19, the resin 26 can be formed into a shape having a uniform liquid surface. When the height of the liquid surface 26a of the resin 26 is lower than that of the third reflectors 19, the resin 26 is divided by the third reflectors 19 and a plurality of liquid surfaces are formed. The heights of the liquid surfaces of the resin for sealing the LEDs 21 are preferably uniform. Then, as shown in FIG. 9C, a space is formed between the third reflectors 19 and the first and second reflectors 17 and 18. In the other words, the third reflector 19 is formed in smaller size than the space between the two reflectors 17 and 18. In this way, the resins for sealing the respective LEDs 21 are connected to each other through the space between the third reflectors 19 and the first and second reflectors 17 and 18. Therefore, the heights of the liquid surfaces 26a of the resins 26 for sealing the respective LEDs 21 becomes uniform.

As shown in FIG. 9C, when the width of the LED 21 is defined as L5 and the width of the third reflector 19 is defined as L6, they shall be set so as to satisfy the expression L6>L5. The width of the third reflector 19 is larger than that of the LED 21.

Part of the lights emitted from the side surface of the LED 21 goes out from the space between the third reflectors 19 and the first and second reflectors 17 and 18. However, the sizes of the first reflector 17 and the second reflector 18 are set relatively longer. Therefore, the light going out from the space between the third reflectors 19 and the first and second reflectors 17 and 18 is securely isotropically-scattered by the inclined reflecting surfaces of the first and the second reflectors. Therefore, the light from the LED may be led to the light guide plate effectively.

The third reflector 19 may be formed integrally with the first reflector 17 and the second reflector 18. In this case, the space is provided only in one side of the third reflector 19. For example, the third reflector 19 may be formed integrally with the first reflector 17 and a space may be provided between the third reflector 19 and the second reflector 18. Alternatively, the third reflector 19 may be formed integrally with the second reflector 18 and a space may be provided between the third reflector 19 and the first reflector 17.

In the light source module according to the invention, since the distance between the first reflector and the second reflector can be decreased, the edge-light type backlight can be thinned and the usage amount of resin can be reduced, hence to cut down the cost.

Further, by providing the third reflectors, the usage amount of resin can be reduced by the amount corresponding to the space occupied by the third reflectors. By providing a space in one side or both sides of the third reflector, the resin can be moved freely and the liquid surface of the resin can be uniform. Therefore, while convenience of single operation of resin sealing is kept, the usage amount of resin can be reduced, hence to reduce the material cost and the number of man-hour.

The light source module of the invention can realize a short light source module with high reliability for a long time at a low cost. Therefore, the height of the backlight of the liquid crystal display device can be reduced.

As mentioned above, although some examples of the invention have been described, the invention is not restricted to the examples but those skilled in the art will understand easily that various modifications can be made in the range of the invention described in Claims.

The invention claimed is:

1. A light source module having a substrate, a first reflector including a reflecting surface, which is formed integrally with the substrate, a light emitting element arranged on the substrate, a wiring board provided on the substrate, a second reflector provided on the wiring board so that the light emitting element is positioned between the first reflector and the second reflector, and a resin for sealing the light emitting element so that a space between the reflecting surface of the first reflector and the reflecting surface of the second reflector is filled with the resin, wherein wherein the light emitting element is attached on a submount so that the submount is attached on the substrate, and the light emitting element and the submount are formed so as to satisfy the following equation:

$$(L2-L1)/2 > t1, \text{ and,}$$

wherein L1 is a size in plan view of the light emitting element, L2 is a size in plan view of the submount, and t1 is a thickness of the light emitting element.

2. The light source module, according to claim 1, in which a space between the submount mounted on the substrate and the wiring board is 50 micron meters or more, or double or more of a diameter of a metal wire connecting the light emitting element to the wiring board.

3. The light source module, according to claim 1, wherein a third reflector is provided which extends in a direction orthogonal to the first and second reflectors, the light emitting element is surrounded by the three reflectors, and a space is formed in one side or both sides of the third reflector.

4. The light source module, according to claim 3, in which the resin is formed into a shape having a uniform liquid surface.

5. A backlight module having the light source module according to claim 1 and a light guide plate, wherein the light guide plate is arranged on the first reflector and the second reflector.

6. A liquid crystal display device having the backlight module according to claim 5, a radiation heat sink, and a liquid crystal panel module, wherein the radiation heat sink is arranged in a rear side opposite to the reflecting surface of the first reflector and connected to the first reflector thermally.

7. The liquid crystal display device, according to claim 6, wherein a recess is formed in an upper portion of the first reflector, with which a lower edge of the light guide plate engages.

8. The liquid crystal display device, according to claim 7, in which
a supporting unit for supporting the liquid crystal panel module is formed in an upper portion of the second reflector.

9. A light source module having a substrate, a first reflector including a reflecting surface, which is formed integrally with the substrate, a light emitting element arranged on the substrate, a wiring board provided on the substrate, a second reflector provided on the wiring board so that the light emitting element is positioned between the first reflector and the second reflector, and a resin for sealing the light emitting element so that a space between the reflecting surface of the first reflector and the reflecting surface of the second reflector is filled with the resin, wherein
wherein the light emitting element is attached on a submount so that the submount is attached on the substrate, and the light emitting element and the submount are formed so as to satisfy the following equation:

$(L2-L1)/2 \geq t1$, and, wherein L1 is a size in plan view of the light emitting element, L2 is a size in plan view of the submount, and t1 is a thickness of the light emitting element; and
a recess for arranging the wiring board is provided in a surface of the substrate on which the light emitting element is provided.

10. The light source module, according to claim 9, in which a space between the submount mounted on the substrate and the wiring board is 50 micron meters or more, or double or more of a diameter of a metal wire connecting the light emitting element to the wiring board.

11. The light source module, according to claim 9, wherein a third reflector is provided which extends in a direction orthogonal to the first and second reflectors, the light emitting element is surrounded by the three reflectors, and a space is formed in one side or both sides of the third reflector.

12. The light source module, according to claim 11, in which the resin is formed into a shape having a uniform liquid surface.

13. A backlight module having the light source module according to claim 9 and a light guide plate, wherein
the light guide plate is arranged on the first reflector and the second reflector.

14. A liquid crystal display device having the backlight module according to claim 13, a radiation heat sink, and a liquid crystal panel module, wherein
the radiation heat sink is arranged in a rear side opposite to the reflecting surface of the first reflector and connected to the first reflector thermally.

15. The liquid crystal display device, according to claim 14, wherein
a recess is formed in an upper portion of the first reflector, with which a lower edge of the light guide plate engages.

16. The liquid crystal display device, according to claim 15, in which
a supporting unit for supporting the liquid crystal panel module is formed in an upper portion of the second reflector.

* * * * *